(12) United States Patent
O'Sullivan et al.

(10) Patent No.: US 6,426,012 B1
(45) Date of Patent: Jul. 30, 2002

(54) WET CHEMICAL ETCH PROCESS FOR PATTERNING MRAM MAGNETIC LAYERS

(75) Inventors: Eugene John O'Sullivan, Nyack; Alejandro Gabriel Schrott, New York, both of NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 09/644,989

(22) Filed: Aug. 24, 2000

(51) Int. Cl.$^7$ .............................. C23F 1/00; C23F 1/44
(52) U.S. Cl. ........................... 216/22; 216/49; 216/57; 216/67; 216/72; 216/75; 216/77; 216/95; 216/100; 216/108; 216/109; 252/79.1
(58) Field of Search .............................. 216/22, 49, 57, 216/67, 72, 75, 77, 95, 100, 108, 109; 252/79.1

(56) References Cited

U.S. PATENT DOCUMENTS

| | | | | |
|---|---|---|---|---|
| 4,462,881 A | * | 7/1984 | Yamamoto et al. | 204/192.15 |
| 4,592,801 A | * | 6/1986 | Hara et al. | 204/192.34 |
| 5,607,599 A | * | 3/1997 | Ichihara et al. | 216/22 |
| 5,938,941 A | * | 8/1999 | Ishiwata et al. | 216/22 |
| 5,945,007 A | * | 8/1999 | Cohen | 216/100 |
| 6,243,939 B1 | * | 6/2001 | Chen et al. | 216/22 |

\* cited by examiner

*Primary Examiner*—Anita Alanko
(74) *Attorney, Agent, or Firm*—Scully, Scott, Murphy & Presser; Manny W. Schecter, Esq.

(57) ABSTRACT

A three-part etching process is employed to selectively pattern exposed magnetic film layers of a magnetic thin film structure. The magnetic structure to be etched includes at least one bottom magnetic film layer and at least one top film layer which are separated by a tunnel barrier layer. The three-part etching process employs various etching steps that selective removing various layers of the magnetic thin film structure stopping on the tunnel barrier layer. The first etching step selective removes any surface oxide that may be present in the passivating layer that is formed on the top magnetic thin film layer, the second etching step selectively removes portions of the passivating layer and the third etching step selectively removes a portion of the exposed magnetic film layer of the structure stopping on the tunnel barrier layer.

22 Claims, 3 Drawing Sheets

WET CHEMICAL ETCH PROCESS FOR PATTERNING MRAM MAGNETIC LAYERS

This application was sponsored by the United States Government under Contract No. MDA 972-99-C-0009, which was awarded by DARPA (Department of Advanced Research Projects Agency); therefore, the United States Government has certain rights and privileges to the present application.

FIELD OF THE INVENTION

The present invention relates to magnetic thin film structures, and in particular to a three-part etching process for selectively etching exposed magnetic layers of a magnetic random access memory (MRAM) stack.

BACKGROUND OF THE INVENTION

Ion milling has been essentially the only method available for creating fine patterns, e.g., submicron patterns, in magnetic thin film structures. Because of the lack of volatile compounds for ferrous metals other than carbonyl, reactive-ion etching (RIE) has not been a viable technique for patterning thin magnetic films; a RIE process based on carbonyl chemistry has not yet been developed. Thus, a chemical etching technique for patterning magnetic thin films based on Fe, Co and Ni is attractive. The MRAM structure represents a complex multilayer system which includes numerous magnetic thin film layers. A typical MRAM structure is shown in FIG. 1. Specifically, the thin film structure shown in FIG. 1 comprises Si substrate 10, $SiO_x$ layer 12, a 150 Å Ti layer 14, $Ni_{81}Fe_{19}$ (40 Å) layer 16, $Ir_{20}Mn_{80}$ (120 Å) layer 18, $Co_{90}Fe1_{10}$ (20 Å) layer 20, $Al_2O_3$ (10 Å) layer 22, $Ni_{81}Fe_{19}$ (40 Å) layer 24 and Ti (100 Å) layer 26. In this prior art magnetic structure, $Al_2O_3$ layer 22 serves as a tunnel barrier between the top magnetic film layer, i.e., $Ni_{81}Fe_{19}$ layer 24, and antiferromagnetic layer 18 and magnetic layers 16 and 20 which are present beneath the tunnel barrier layer. Layer 26 is a passivating layer that prevents moisture, air or other contaminants from entering into the structure, while layer 14 is an adhesion layer.

As can be seen, the magnetic films of the MRAM structure illustrated in FIG. 1 are quite thin. Patterning of the MRAM structure of FIG. 1 is typically carried out in the prior art by first applying a mask to the MRAM structure and patterning the mask by lithography (exposure and development). FIG. 2 shows the structure after these steps wherein reference numeral 28 represents the patterned mask. The pattern is then transferred to the MRAM structure by first removing the top 100 Å Ti film of the MRAM structure by either RIE or wet etching, and then a standard aqueous acid solution such as sulfuric and nitric acid is employed to etch the exposed free-magnetic $Ni_{81}Fe_{19}$ (40 Å) layer. Although acid etchants are capable of etching through the exposed top magnetic layer of the structure, acid etchants are not selective for removing just that exposed magnetic layer. Instead, when acid etchants are employed, they also etch the underlying alumina tunnel barrier layer, the $Co_{90}Fe_{10}$ layer, and the Mn in the $Ir_{20}Mn_{80}$ layer of the magnetic thin film stack providing the structure shown in FIG. 3.

Despite being capable of etching numerous magnetic layers in the MRAM structure, the use of prior art aqueous acid solutions causes Galvanic-coupling-accelerated dissolution of the $Co_{90}Fe_{10}$ (20 Å) layer in the film region under the mask which is unacceptable for many applications. An ideal situation would be to etch through the top barrier layer and the top exposed magnetic layer, i.e., layer 24, stopping at the thin $Al_2O_3$ layer, thereby leaving the underlying layers, i.e., layers 16, 18, and 20, unetched.

To date, applicants are unaware of any etching process which selectively etches a magnetic thin film structure so as to stop on the tunnel barrier layer present in the structure. There is thus a need for developing an etching process which is capable of selectively etching the magnetic thin film structure so as to provide a patterned structure wherein the pattern is not formed in the tunnel barrier layer or the magnetic layers that are located beneath the tunnel barrier layer of the structure. Such an etching process would be beneficial since it would prevent unwanted Galvanic corrosion of the inner magnetic layers, while being able to pattern the top barrier layer and the top magnetic film layer of the structure.

SUMMARY OF THE INVENTION

The present invention is directed to a method of selectively patterning the top magnetic film layers of a magnetic structure stopping on the tunnel barrier layer in which the various etching processes employed do not adversely damage the tunnel barrier layer and the magnetic thin film layers that are present beneath the tunnel barrier layer. The aforementioned object is achieved by utilizing a three-part selective etching process. Specifically, the above object is obtainable utilizing processing steps that include:

(a) providing a magnetic structure which includes at least one bottom magnetic film layer and at least one top magnetic film layer, wherein said top and bottom magnetic film layers are separated by a tunnel barrier layer, and said at least one top magnetic film layer having a passivating layer formed thereon, said passivating layer including a surface oxide region formed therein;

(b) forming a patterned resist on said passivating layer wherein a portion of said passivating layer is exposed;

(c) removing said surface oxide layer from said exposed portion of said passivating layer by reactive-ion etching;

(d) selectively etching said exposed portion of said passivating layer by a wet etch process which includes an etchant solution comprising an organic acid, a fluoride salt and an inhibitor which prevents pitting and dissolution of said at least one top magnetic film layer whereby a portion of said at least one top magnetic film layer is exposed; and (e) selectively etching said exposed portion of said at least one top magnetic film layer by a wet etch process which includes a dicarboxylic acid aqueous etchant solution stopping on said tunnel barrier layer.

In one alternative embodiment of the present invention, a sulfur-containing compound is added to the three-component etchant solution of step (d); and, in another alternative embodiment of the present invention, the three-component etchant solution of step (d) is replaced by a $SF_6$-RIE plasma etching process.

DESCRIPTION OF THE INVENTION

Figure 1:
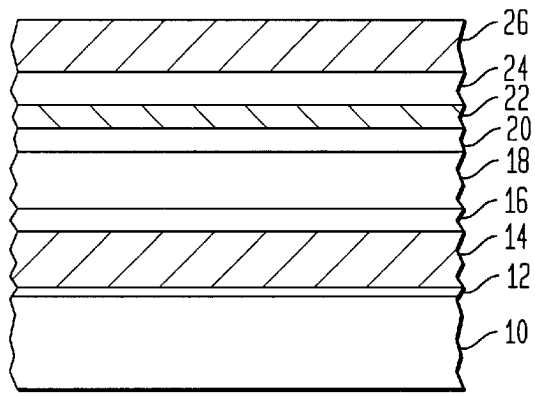
FIGS. 1–3 are pictorial views illustrating a typical prior art process of patterning a magnetic thin film structure.
Figure 2:
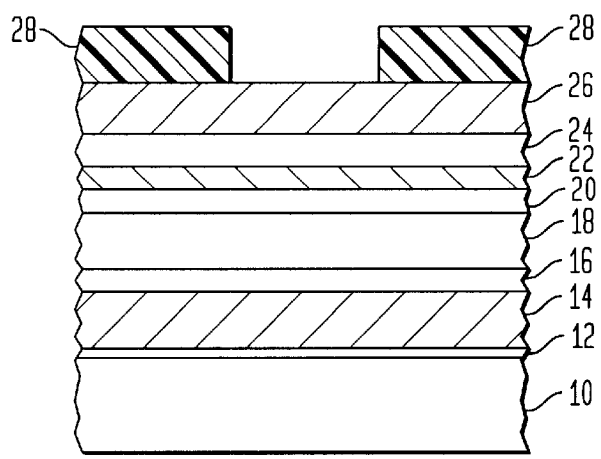
Figure 3:
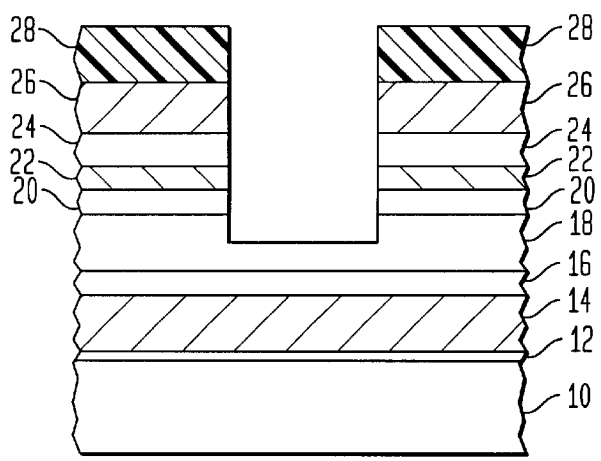

The present invention which provides a method for selectively etching the exposed top magnetic thin film layers of a magnetic thin film structure without adversely affecting the tunnel barrier layer or the underlaying magnetic thin film layers will now be described in more detail by referring to the drawings that accompany the present application.

Figure 4:
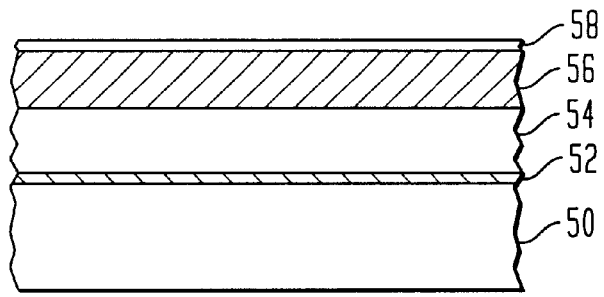
FIGS. 4–8 are pictorial views illustrating the basic processing steps of the present invention which are used in patterning a magnetic thin film structure.

Reference is first made to FIG. 4 which includes a portion of a magnetic thin film structure that can be utilized in the present invention. Specifically, the portion of the magnetic structure shown in FIG. 4 includes at least one bottom magnetic thin film layer 50 and at least one top magnetic film layer 54 which are separated by tunnel barrier layer 52. The uppermost surface layer of top magnetic layer 54 has a passivating layer 56 formed thereon and the passivating layer includes surface oxide layer 58. The portion of the magnetic thin film structure shown in FIG. 4 may further include a semiconductor substrate, a $SiO_x$ layer and a Ti layer or other adhesion layer which would be located beneath the at least one bottom magnetic film layer. When these elements are present, the magnetic thin film structure would look similar to the one depicted in FIG. 1. For clarity however the material layers located beneath the at least one bottom magnetic film layer are not shown in FIGS. 4–8.

The portion of the magnetic thin film structure illustrated in FIG. 4 is formed utilizing conventional techniques well known in the art that are capable of forming such a structure. For example, the various magnetic and non-magnetic layers may be formed by utilizing the same or different deposition process selected from the group consisting of chemical vapor deposition (CVD), plasma-assisted CVD, plating, evaporation, sputtering, chemical solution dissolution and other like deposition processes.

The magnetic film layers (including bottom and top) of the illustrated structure may be composed of the same or different magnetic and/or antiferromagnetic layers in which each individual layer has a thickness of less than 150 Å. Preferably, each individual magnetic film layer has a thickness of less than 100 Å.

Illustrative examples of magnetic films that can be employed in the present invention include, but are not limited to: $Ni_xFe_y$, $Ni_xCo_yFe_z$, $Ir_xMn_y$, and other like magnetic films. In the above formulas, x, y and z are any integers whose sum adds up to 100. In accordance with the present invention, the bottom magnetic film layer as well as the top magnetic film layer may comprise only one magnetic film or they may comprise a stack of magnetic films.

In one embodiment of the present invention, the top magnetic film is comprised of a Permalloy layer, i.e., $Ni_xFe_y$, or a $Co_xFe_y$ layer, while the bottom magnetic film layer comprises a stack consisting of $Ni_xFe_y$, $Co_xFe_y$ and $Ir_xMn_y$ or $Ni_xFe_y$ and $Co_xFe_y$.

In one embodiment of the present invention, any exposed edges of the magnetic structure may be coated with a conventional passivating material so as to prevent certain underlying films, notably the noble metal containing exchange bias layer from engaging in Galvanic type reactions that could inhibit the etching process.

The tunnel barrier layer employed in the present invention includes any conventional material layer such as $Al_2O_3$ which is capable of sustaining a tunneling current and which does not chemically degrade the properties of the top and bottom magnetic layers. In some instances, the tunnel barrier layer may also serve as a diffusion barrier. The tunnel barrier layer employed in the present invention is a thin layer which has a thickness of less than about 15 Å.

The passivating layer employed in the present invention includes any metal layer such as Ti, TiN, Ta, or TaN which serves as a barrier layer preventing diffusion of moisture, air and other contaminants from coming into contact with the underlaying magnetic layers and the tunnel barrier layer. The thickness of this layer may vary, but typically the passivating layer has a thickness of from about 20 to about 1000 Å.

As indicated above, the passivating layer contains a surface oxide layer therein which is formed on the passivating layer when the structure is exposed to air.

Figure 5:
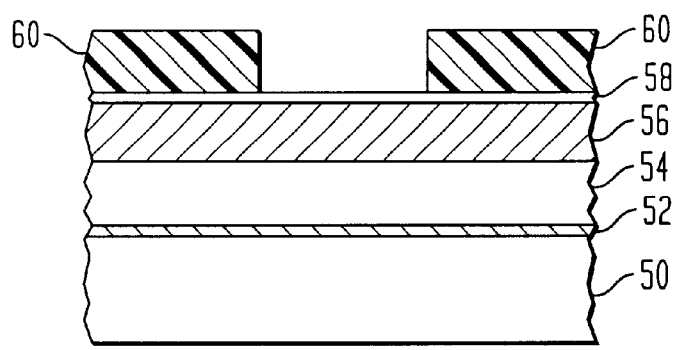
Figure 6:
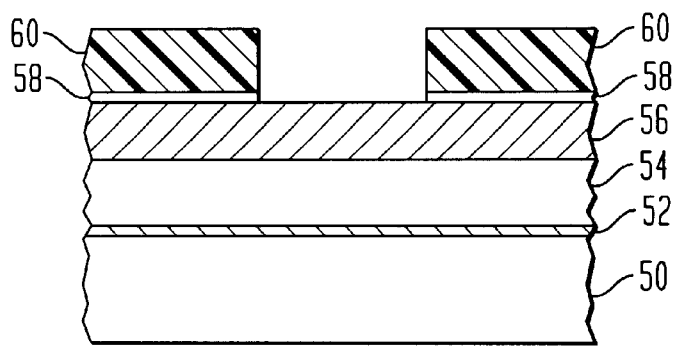
Figure 7:
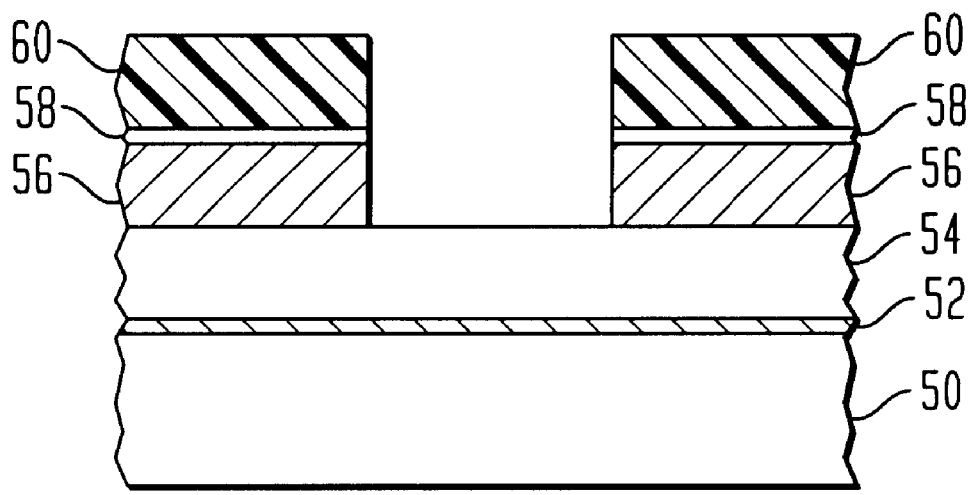

Next, and as illustrated in FIG. 5, patterned resist 60 is formed on the surface of the passivating layer of the magnetic thin film structure shown in FIG. 4 utilizing conventional lithography. Specifically, the lithography process includes: (i) applying a conventional resist to the passivating layer of the magnetic thin film structure via a conventional deposition process such as spin-on coating, dip coating, CVD, plasma-assisted CVD, evaporation and chemical solution dissolution; (ii) exposing the resist to radiation so as to form a desired pattern therein; and (iii) developing the desired pattern using a conventional developer solution so as to expose a portion of the passivating layer.

Following the formation of the patterned resist on the surface of the passivating layer, the inventive three-part etching process, which will be described in more detail below, is then performed. First, the surface oxide layer in the exposed portion of the passivating layer is removed by utilizing a reactive-ion etching (RIE) process providing the structure shown FIG. 6. The RIE process may include $CF_4/Ar$ or $CBrF_3/SF_6$ as etchant gases.

In one embodiment of the present invention, an optional oxygen ashing process is performed prior to removing the surface oxide layer. The optional oxygen ashing process includes the use of oxygen ashing conditions well known to those skilled in the art that are capable of removing any etched resist residue from the exposed surface of the passivating layer. In another embodiment of the present invention, a conventional oxygen ashing process which is capable of removing any fluorine-related resist residue may be performed after conducting the above described RIE step.

It should be noted that although each of the above described etching processes may be performed in single steps, the present invention also includes etching processes wherein all three of the above described etching steps are performed using one RIE run.

Next, the exposed portion of the passivating layer that does not include any inert surface oxide layer is then subjected to a wet etch process which includes the use of a solution that comprises an organic acid, a fluoride salt and an inhibitor which prevents pitting and dissolution of the at least one top magnetic film layer. In this step of the present invention, the passivating layer is selectively patterned so as to expose a portion of the at least one top magnetic film layer, See FIG. 7. It should be noted that by using the above described etchant solution, the etching process does not cause any pitting of the underlaying magnetic layer(s).

As indicated above, the etchant solution used in this step of the present invention includes at least three required components. The first of the required components is an organic acid which is selected from the group consisting of ethylenediamine diacetic acid, ethylenediamine tetraacetic acid, succinic acid, acetic acid, other carboxylic acids having a $PK_a$ greater than 3 and mixtures thereof. Of these organic acids, ethylenediamine tetraacetic acid is most preferred.

The second required component of the etchant solution is a fluoride salt such as sodium fluoride, potassium fluoride, or tetramethylammonium fluoride or mixtures thereof. Of these fluoride salts, sodium fluoride is most preferred.

The third required component of the etchant solution is an inhibitor which not only serves to inhibit the dissolution of the underlying magnetic layer(s), but also serves to protect the underlying magnetic layer(s) from oxidation and passivation. Suitable inhibitors that can be employed in the present invention include, but are not limited to: benzotriazole, tolyltriazole, carbonylbenzo-triazole, and other members of the triazole family, or mixtures thereof. Of these inhibitors, benzotriazole is most preferred.

The three component etchant solution employed in removing the passivating layer typically includes a mole ratio of organic acid to fluoride salt to inhibitor of from about 0.02:0.01:0.01 to about 0.2:0.5:0.1, with a mole ratio of organic acid to fluoride salt to inhibitor of from about 0.04:0.05:0.03 to about 0.1:0.25:0.06 being more preferred.

In another embodiment of the present invention, the etchant solution includes a sulfur-containing compound in addition to the three required components described above. Sulfur-containing compounds are believed to adsorb and dissociate on the surface of the newly exposed magnetic film layer. The S-fragment that is formed during dissociation remains on the surface of the newly exposed magnetic film layer and prevents effective passivation of the magnetic film layer from occurring in a subsequent rinsing step.

Illustrative examples of sulfur-containing compounds that may be included with the three-component etchant solution include, but are not limited to: thiourea, allyl-2-thiourea, N,N-dimethylthiourea, 1,1,3,3-tetramethyl-2-thiourea or mixtures thereof. Of these sulfur-containing compounds, thiourea is most preferred in the present invention.

When present, the sulfur-containing compound is employed in an amount such that the mole ratio of organic acid to fluoride salt to inhibitor to sulfur-containing compound is from about 0.02:0.01:0.01:0.0005 to about 0.2:0.5:0.1:0.1, with a mole ratio of organic acid to fluoride salt to inhibitor to sulfur-containing compound of from about 0.04:0.05:0.03:0.002 to about 0.1:0.25:0.06:0.010 being more preferred.

Notwithstanding whether a three- or four-component etchant solution is employed, this step of the present invention which removes the passivating layer is conducted at room temperature for a time period of from about 30 to about 120 secs.

Alternatively, and when a Ta (or TaN) passivating layer is employed, the above etching step which includes the use of a three- or four-component etchant solution may be replaced with a $SF_6$ RIE plasma etching process. The use of $SF_6$ RIE plasma etching to remove the Ta (or TaN) passivating layer also modifies the surface of the exposed magnetic layer to include sulfur. Alternatively, another RIE etchant gas which removes Ta (or TaN) could be used first and thereafter the etched surface is treated with a $SF_6$ gas.

The presence of sulfur on a magnetic thin film layer is advantageous since sulfur-containing magnetic film layers etch at a much faster rate than magnetic film layers which does not include sulfur fragments.

Figure 8:
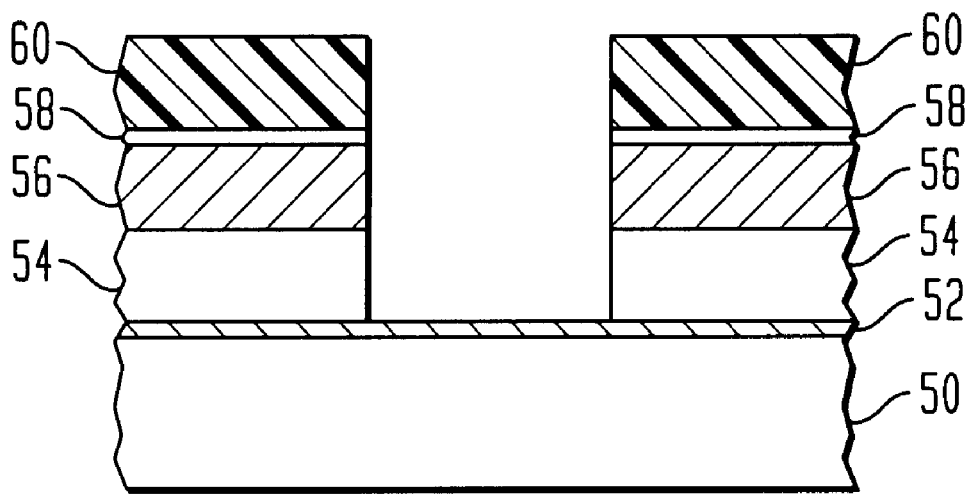

FIG. 8 shows the next step of the present invention in which exposed top magnetic film layer is selectively etched utilizing an etching process that is capable of stopping on the tunnel barrier layer. In this step of the present invention, the exposed magnetic film layer is selectively etched utilizing an etchant solution that comprises a dicarboxylic acid such as glutaric acid, adipic acid or suberic acid. The etchant solution typically comprises from about 0.5 to about m parts by weight of a dicarboxylic acid per 100 parts by weight water where m is limited by the solubility of the acid.

This etching step is also carried out at room temperature for a period of time of from about 15 to about 1200 secs. No substantial etching of the tunnel barrier occurs using the dicarboxylic acid etchant solution which is not the case utilizing conventional acids such as dilute sulfuric, nitric of sulfamic acids. Moreover, no substantial pitting of the barrier layer and the underlying magnetic layers occurs by utilizing this step of the present invention.

Following the third etching step of the present invention, the patterned structure may be rinsed with a suitable inert solvent or supercritical fluid and the patterned resist may then be stripped utilizing any well known stripping process. The patterned magnetic structure may then be subjected to conventional MRAM processing techniques also well known to those skilled in the art.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of selectively patterning the top magnetic film layer of a magnetic film structure comprising the steps of:

(a) providing a magnetic structure which includes at least one bottom magnetic film layer and at least one top magnetic film layer, wherein said top and bottom magnetic film layers are separated by a tunnel barrier layer, and said at least one top magnetic film layer having a passivating layer formed thereon, said passivating layer including a surface oxide region formed therein;

(b) forming a patterned resist on said passivating layer wherein a portion of said passivating layer is exposed;

(c) removing said surface oxide layer from said exposed portion of said passivating layer by reactive-ion etching;

(d) selectively etching said exposed portion of said passivating layer by a wet etch process which includes an etchant solution comprising an organic acid, a fluoride salt and an inhibitor which prevents pitting and dissolution of said at least one top magnetic film layer whereby a portion of said at least one top magnetic film layer is exposed; and (e) selectively etching said exposed portion of said at least one top magnetic film layer by a wet etch process which includes a dicarboxylic acid aqueous etchant solution stopping on said tunnel barrier layer.

2. The method of claim 1 wherein said at least one top magnetic film layer and said at least one bottom magnetic film layer are the same or different and are $Ni_xFe_y$, $Ni_xCo_yFe_z$, $Co_xFe_y$, or $Ir_xMn_y$ wherein x, y and z are any integers whose sum adds up to 100.

3. The method of claim 2 wherein said at least one top magnetic film layer is $Ni_xFe_y$ and the at least one bottom magnetic film layer is a stack comprising $Ni_xFe_y$, $Co_xFe_y$, or $Ir_xMn_y$.

4. The method of claim 1 wherein said passivating layer is Ti, Ta, TiN or TaN.

5. The method of claim 1 wherein said tunnel barrier layer is $Al_2O_3$.

6. The method of claim 1 wherein each magnetic film layer has a thickness of less than 150 Å.

7. The method of claim 1 wherein said patterned resist is formed by lithography including applying a resist, exposing the resist to a pattern of radiation and developing the pattern.

8. The method of claim 1 wherein an optional oxygen ashing step is carried out prior to conducting step (c).

9. The method of claim 1 wherein said reactive-ion etching employed in step (c) includes $CF_4/Ar$ or $CBrF_3/SF_6$ based chemistry.

10. The method of claim 1 wherein after conducting step (c), but prior to conducting step (d), an optional oxygen ashing step is performed.

11. The method of claim 1 wherein said organic acid is ethylenediamine diacetic acid, ethylenediaminetetraacetic acid, succinic acid, acetic acid, other carboxylic acids having a $pK_a$ greater than 3 or mixtures thereof.

12. The method of claim 1 wherein said fluoride salt is sodium fluoride, potassium fluoride, tetramethylammonium fluoride or mixtures thereof.

13. The method of claim 1 wherein said inhibitor is benzotriazole, tolyltriazole, carbonylbenzotriazole, other members of the triazole family or mixtures thereof.

14. The method of claim 1 wherein said organic acid is ethylenediamine tetraacetic acid, said fluoride salt is sodium fluoride, and said inhibitor is benzotriazole.

15. The method of claim 1 wherein said organic acid, said fluoride salt and said inhibitor are present in said etchant in a mole ratio of from about 0.02:0.01:0.01 to about 0.2:0.5:0.1, respectively.

16. The method of claim 15 wherein said organic acid, said fluoride salt and said inhibitor are present in said etchant in a mole ratio of from about 0.04:0.05:0.03 to about 0.1:0.25:0.06, respectively.

17. The method of claim 1 wherein said etchant solution employed in step (d) further includes a sulfur-containing compound.

18. The method of claim 17 wherein said sulfur-containing compound is thiourea, allyl-2-thiourea, N,N-dimethylthiourea, 1,1,3,3-tetramethyl-2-thiourea or mixtures thereof.

19. The method of claim 17 wherein said etchant contains a mole ratio of said organic acid to said fluoride salt to said inhibitor to said sulfur-containing compound of from about 0.02:0.01:0.01:0.0005 to about 0.2:0.5:0.1:0.1.

20. The method of claim 19 wherein said etchant contains a mole ratio of said organic acid to said fluoride salt to said inhibitor to said sulfur-containing compound of from about 0.04:0.05:0.03:0.002 to about 0.1:0.25:0.06:0.010.

21. The method of claim 1 wherein step (d) is replaced by step (d') which includes selectively etching said exposed portion of said passivating layer by $SF_6$ RIE plasma etching.

22. The method of claim 1 wherein said dicarboxylic acid is glutaric acid, adipic acid, or suberic acid.

* * * * *

UNITED STATES PATENT AND TRADEMARK OFFICE
CERTIFICATE OF CORRECTION

PATENT NO.    : 6,426,012 B1
DATED         : July 30, 2002
INVENTOR(S)   : E. O'Sullivan et al.

It is certified that error appears in the above-identified patent and that said Letters Patent is hereby corrected as shown below:

Column 3,
Line 39, "$Ni_xFe_y$, $Ni_xCo_yFe_z$, $Ir_xMn_y$" should read -- $Ni_xCo_yFe_z$, $Co_yFe_z$, $Ir_xMn_y$ --

Signed and Sealed this

Twenty-ninth Day of April, 2003

JAMES E. ROGAN
*Director of the United States Patent and Trademark Office*